(12) United States Patent
Suzuki et al.

(10) Patent No.: US 9,638,721 B2
(45) Date of Patent: May 2, 2017

(54) CURRENT SENSOR INSPECTION SYSTEM AND CURRENT SENSOR INSPECTION METHOD

(71) Applicant: JAPAN AVIATION ELECTRONICS INDUSTRY, LIMITED, Tokyo (JP)

(72) Inventors: Toshikazu Suzuki, Tokyo (JP); Hisashi Nishimura, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 103 days.

(21) Appl. No.: 14/664,059

(22) Filed: Mar. 20, 2015

(65) Prior Publication Data
US 2015/0355240 A1 Dec. 10, 2015

(30) Foreign Application Priority Data

Jun. 5, 2014 (JP) ................................. 2014-116769

(51) Int. Cl.
*G01R 15/18* (2006.01)
*G01R 35/00* (2006.01)
*G01R 19/00* (2006.01)

(52) U.S. Cl.
CPC ........... *G01R 15/183* (2013.01); *G01R 35/00* (2013.01); *G01R 19/0092* (2013.01)

(58) Field of Classification Search
CPC ......... G01R 35/00; G01R 19/00; G01R 15/18
USPC ................................................. 324/127, 202
See application file for complete search history.

(56) References Cited

U.S. PATENT DOCUMENTS

| | | | | |
|---|---|---|---|---|
| 4,100,488 A | * | 7/1978 | Quietzsch | G01R 1/22 324/117 R |
| 6,570,373 B1 | * | 5/2003 | Viola | G01R 35/005 324/117 H |
| 2003/0169031 A1 | | 9/2003 | Viola | |
| 2010/0148907 A1 | * | 6/2010 | Younsi | H01F 38/30 336/180 |
| 2012/0001617 A1 | | 1/2012 | Reynolds | |
| 2012/0319674 A1 | * | 12/2012 | El-Essawy | G01R 35/04 324/74 |
| 2013/0076343 A1 | | 3/2013 | Carpenter et al. | |

(Continued)

FOREIGN PATENT DOCUMENTS

WO WO2012038161 3/2012

OTHER PUBLICATIONS

European Search Report, mailed Oct. 26, 2015, with respect to European Patent Application. No. 15162979.7.

*Primary Examiner* — Clayton E Laballe
*Assistant Examiner* — Noam Reisner
(74) *Attorney, Agent, or Firm* — Greenblum & Bernstein, P.L.C.

(57) ABSTRACT

A current sensor inspection system according to the present invention comprises a first wire, a second wire, a direct-current power supply device and an alternating-current power supply device. The first wire and the second wire are insulated from each other and pass through the plane surrounded by the core. The direct-current power supply device is capable of outputting a value of a direct current. The alternating-current power supply device is capable of outputting a value of an alternating current. Only the direct-current power supply device is connected to the first wire, and only the alternating-current power supply device is connected to the second wire.

10 Claims, 4 Drawing Sheets

(56) References Cited

U.S. PATENT DOCUMENTS

2013/0138372 A1* 5/2013 Ausserlechner ..... G01R 15/207
702/65
2013/0335100 A1 12/2013 Boehm et al.

* cited by examiner

Fig. 7 A
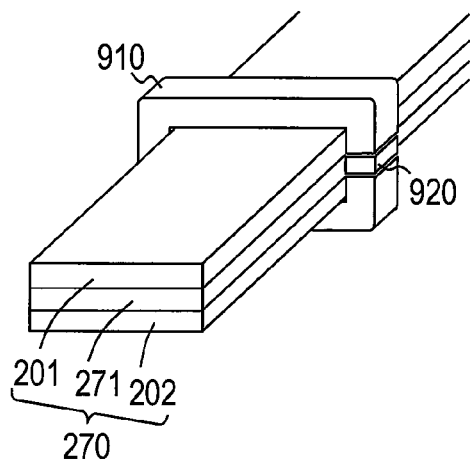
Fig. 7 B
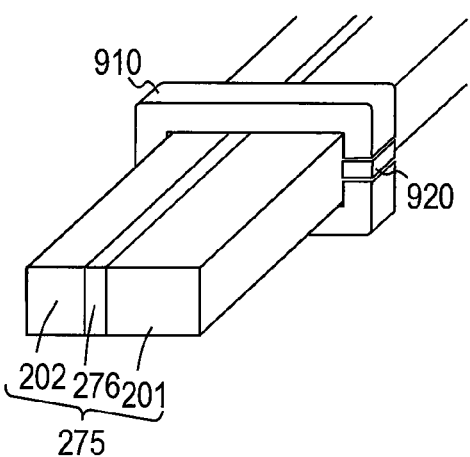
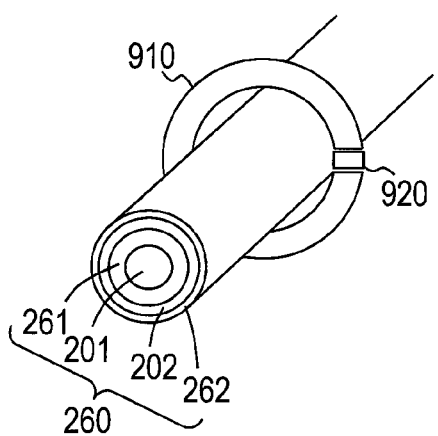
Fig. 8

CURRENT SENSOR INSPECTION SYSTEM AND CURRENT SENSOR INSPECTION METHOD

CROSS REFERENCE TO RELATED APPLICATIONS

This application is based on Japanese Patent Application No. 2014-116769 filed on Jun. 5, 2014, the content of which is incorporated by reference herein.

TECHNICAL FIELD

The present invention relates to a current sensor inspection system and a current sensor inspection method for inspection of a current sensor that measures a direct current and an alternating current at the same time.

BACKGROUND ART

In International Publication No. WO2012/038161 (referred to as Patent Literature 1 hereinafter), a technique of inspecting a current sensor is described. Patent Literature 1 shows a method of inspecting a current sensor that measures a battery current as to whether the current sensor normally operates or not. FIG. 1 is a diagram showing FIG. 1 of Patent Literature 1. In Abstract of Patent Literature 1, there is a description that "During a precharge phase (32) which begins at a time (34) at which at least one electrical component (20, 22, 24) is connected to a battery (100) and during which the electrical component (20, 22, 24) is precharged by a precharge current, at least one measured value provided by the current sensor is compared with an expected current value determined from an expected temporal profile of the precharge current.".

FIG. 2 shows a configuration of a current sensor that is capable of measuring a direct current and an alternating current at the same time. A current sensor 900 comprises a core 910, a magnetometric sensor 920 and a main unit 930. The core 910 is made of a magnetic material (such as iron) and has the shape of a ring with a gap. The magnetometric sensor 920 is disposed in the gap of the core 910 and measures a current passing through a plane 911 surrounded by the core 910 by measuring a magnetic flux inside the core 910. A Hall element is commonly used as the magnetometric sensor 920. The main unit 930 displays and outputs the measurement result.

SUMMARY OF THE INVENTION

The inspection method described in Patent Literature 1 is directed to a current sensor for measuring a small current and is not directed to a current sensor for measuring a large current. Although we are unaware of any literature describing such an approach, a current sensor that measures a direct current of 100 A or larger and an alternating current at the same time can be inspected by first solely passing a direct current to examine direct-current characteristics of the current sensor and then solely passing an alternating current to examine alternating-current characteristics of the current sensor. However, for the reasons described below, it is difficult to inspect a current sensor by passing a superimposed current of a direct current of 100 A or larger and an alternating current.

FIG. 3 shows a configuration of a circuit that uses a transformer to superimpose a direct current and an alternating current on one another. The circuit shown in FIG. 3 has a direct-current power supply device 210, an alternating-current power supply device 220, a transformer 230 and a wire 200. The current sensor 900 measures a current flowing through the wire 200. The direct-current power supply device 210 has a direct-current power supply 211 and a resistor 212, and the alternating-current power supply device 220 has an alternating-current power supply 221 and a resistor 222. The transformer 230 superimposes an alternating-current component flowing on the side of the alternating-current power supply device 220 on a direct-current component flowing on the side of the direct-current power supply device 210, and thus a superimposed current of a direct current and an alternating current flows through the wire 200.

However, if the core of the transformer 230 is magnetically saturated by the direct current of 100 A, the alternating current is not superimposed as predicted by theory. In this case, the alternating current actually flowing through the wire 200 is smaller than the value theoretically determined from the current value of the alternating-current power supply device 220, and inspection of the current sensor 900 fails. Therefore, the core of the transformer 230 is desirably made of a material having high saturation flux density. Magnetic steel sheets have high saturation flux density but have a problem that an eddy-current loss increases at frequencies equal to or higher than 100 Hz. Cores that are unlikely to suffer from the problem of eddy-current loss include ferrite cores and amorphous cores. However, ferrite cores have low saturation flux density and are not suitable for direct-current application. Amorphous cores need to be structured by taking stresses into consideration because the saturation flux density of the amorphous cores decreases because of external stresses. Therefore, the amorphous cores need to be very large and expensive. The amorphous cores also suffer from a problem that the eddy-current loss increases at frequencies of 5 kHz or higher. Furthermore, to pass a direct current of 100 A requires a thick wire (having a diameter of 5 mm or greater), and such a thick wire can only be wound around a still larger core. Thus, there is no practical approach.

FIG. 4 is a configuration of a circuit that uses a capacitor to superimpose a direct current and an alternating current on one another. The circuit shown in FIG. 4 has a direct-current power supply 211, an alternating-current power supply 221, a resistor 242, a capacitor 240, and a wire 200. The capacitor 240 superimposes an alternating current and a direct current on one another, and thus a superimposed current flows through the wire 200.

With this circuit configuration, the capacitance of the capacitor 240 depends on a resistance R of the resistor 242 and the value of the alternating current. Considering that a direct current of 100 A flows through the resistor 242, the resistance R is desirably low to reduce the power consumption. For example, suppose that the resistance R of the resistor 242 is 0.01Ω. Then, the power consumption is 100 W (=$100^2 \times 0.01$) when the direct current is 100 A. If an alternating current at 1 kHz is applied and a cutoff frequency $f_c$ of the filter formed by the capacitor 240 and the resistor 242 is set at 10 Hz, which is sufficiently low, the capacitance C of the capacitor 240 is 1.6 F according to the following formula. Thus, a very large capacitor is needed.

$$f_c = 10 \text{ Hz}, R = 0.01 \text{ } \Omega$$

$f_c = \frac{1}{2\pi CR}$, which can be written as: $C = \frac{1}{2\pi f_c R} \cong 1.6$ F Furthermore, to measure the phase of the alternating current in steps of 0.1 degrees or less, the capacitance needs to be still higher considering variations of the capacitance of the capacitor 240. Thus, an impractically large inspection device is needed to measure a superposed current of a direct current of 100 A and an alternating current of 10 A.

The present invention has been devised in view of such problems, and an object of the present invention is to provide a simple current sensor inspection system used to check that a current sensor normally operates when an alternating current is superimposed on a direct current.

A current sensor has a core made of a magnetic material and having the shape of a ring with a gap and a magnetometric sensor disposed in the gap and measures a current passing through a plane surrounded by the core by measuring a magnetic flux inside the core with the magnetometric sensor.

A current sensor inspection system according to the present invention inspect the current sensor. A first current sensor inspection system according to the present invention comprises a first wire, a second wire, a direct-current power supply device and an alternating-current power supply device. The first wire and the second wire are insulated from each other and pass through the plane surrounded by the core. The direct-current power supply device is capable of supplying a direct current of 100 A or larger and outputting a value of a direct current. The alternating-current power supply device is capable of outputting a value of an alternating current. Only the direct-current power supply device is connected to the first wire. Only the alternating-current power supply device is connected to the second wire.

A second current sensor inspection system according to the present invention comprises a coaxial cable, a direct-current power supply device and an alternating-current power supply device. The coaxial cable has two conductor layers that pass through the plane surrounded by the core. The direct-current power supply device is capable of outputting a value of a direct current. The alternating-current power supply device is capable of outputting a value of an alternating current. Only the direct-current power supply device is connected to an inner conductor layer of the coaxial cable. Only the alternating-current power supply device is connected to an outer conductor layer of the coaxial cable.

A first current sensor inspection method according to the present invention comprises a placement step, a first connection step, a second connection step and an inspection step. In the placement step, a first wire and a second wire insulated from each other are placed so as to pass through a plane surrounded by a core. In the first connection step, a direct-current power supply device is connected to the first wire, the direct-current power supply device being capable of supplying a direct current of 100 A or larger and outputting a value of a direct current. In the second connection step, an alternating-current power supply device is connected to the second wire, the alternating-current power supply device being capable of outputting a value of an alternating current. In the inspection step, the direct-current power supply device and the alternating-current power supply device provide currents at the same time, a value of a direct current output from the direct-current power supply device is compared with a value of a direct current output from the current sensor, and a value of an alternating current output from the alternating-current power supply device is compared with a value of an alternating current output from the current sensor.

A second current sensor inspection method according to the present invention comprises a placement step, a first connection step, a second connection step and an inspection step. In the placement step, a coaxial cable having two conductor layers is placed so as to pass through a plane surrounded by a core. In the first connection step, a direct-current power supply device is connected to an inner conductor layer of the coaxial cable, the direct-current power supply device being capable of outputting a value of a direct current. In the second connection step, an alternating-current power supply device is connected to an outer conductor layer of the coaxial cable, the alternating-current power supply device being capable of outputting a value of an alternating current. In the inspection step, the direct-current power supply device and the alternating-current power supply device provide currents at the same time, a value of a direct current output from the direct-current power supply device is compared with a value of a direct current output from the current sensor, and a value of an alternating current output from the alternating-current power supply device is compared with a value of an alternating current output from the current sensor.

With the first current sensor inspection system according to the present invention, taking advantage of the characteristics of the current sensor that measures the current passing through the plane surrounded by the core, the direct current and the alternating current are not superimposed in one wire but passed through two wires insulated from each other. Therefore, the current sensor inspection system according to the present invention does not require any arrangement for superimposition of currents and therefore has a simple configuration, and thus the current sensor inspection system can precisely control the current passing through the core. The current sensor measures a combined current passing through the plane surrounded by the core regardless of whether the current is passing through either or both of the two wires, so that it is possible to inspect the operation of the current sensor when a direct current and an alternating current are superimposed on one another.

With the second current sensor inspection system according to the present invention, the inner conductor layer of the coaxial cable is less affected by the alternating current, so that the current sensor can be more precisely inspected with a simpler configuration.

BRIEF DESCRIPTION OF THE DRAWINGS

FIG. 7A is a diagram showing a first arrangement of the core 910, the first wire 201 and the second wire 202 for inspecting a current flowing through a bus bar;

FIG. 7B is a diagram showing a second arrangement of the core 910, the first wire 201 and the second wire 202 for inspecting a current flowing through the bus bar; and FIG. 8 is a diagram showing a coaxial cable 260 having two conductor layers, an inner one of which is formed by the first wire 201 and an outer one of which is formed by the second wire 202.

DETAILED DESCRIPTION OF THE EMBODIMENTS

Figure 1:
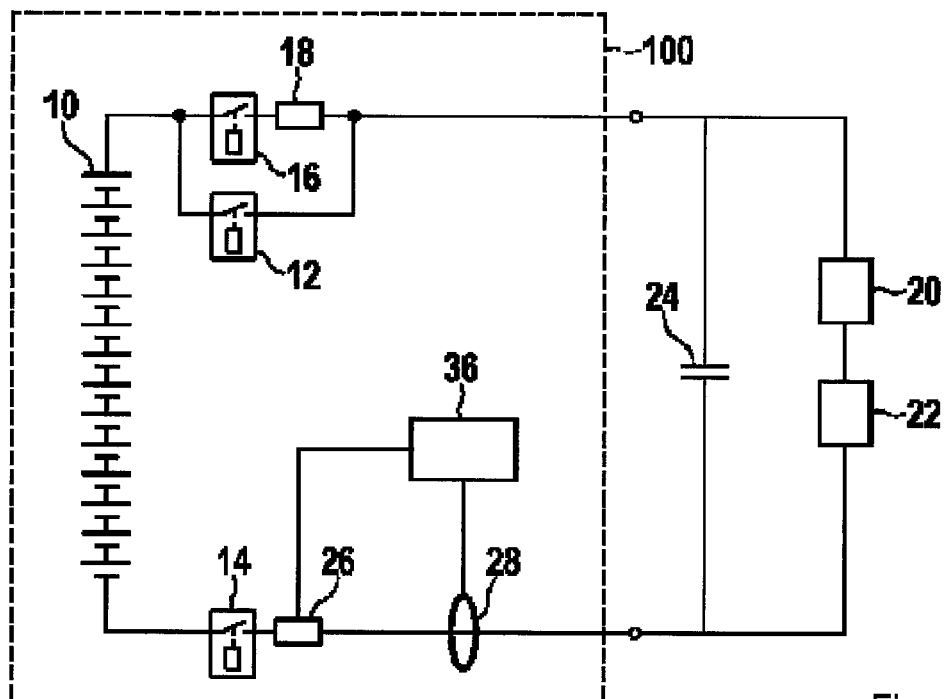
FIG. 1 is a diagram showing FIG. 1 of Patent Literature 1.

In the following, embodiments of the present invention will be described in detail. The same components having the same functions are denoted by the same reference numerals, and redundant description thereof will be omitted.

First Embodiment

Figure 2:
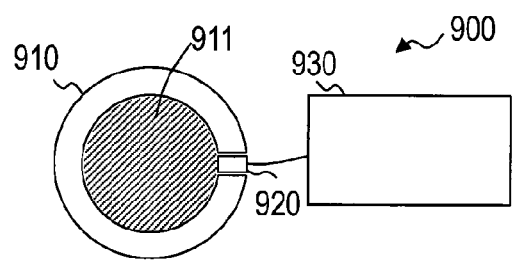
FIG. 2 is a diagram showing a configuration of a current sensor that is capable of measuring a direct current and an alternating current at the same time.
Figure 3:
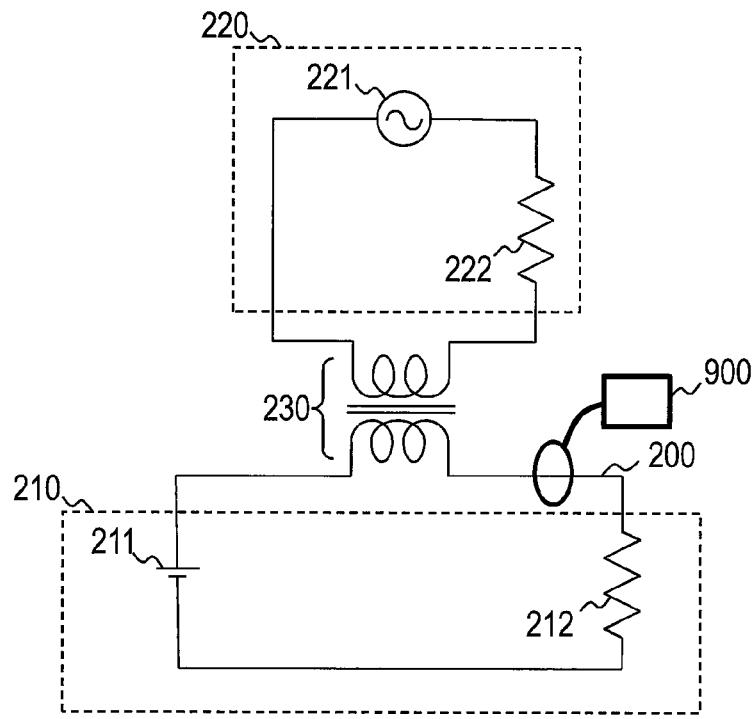
FIG. 3 is a diagram showing a configuration of a circuit that uses a transformer to superimpose a direct current and an alternating current on one another.
Figure 4:
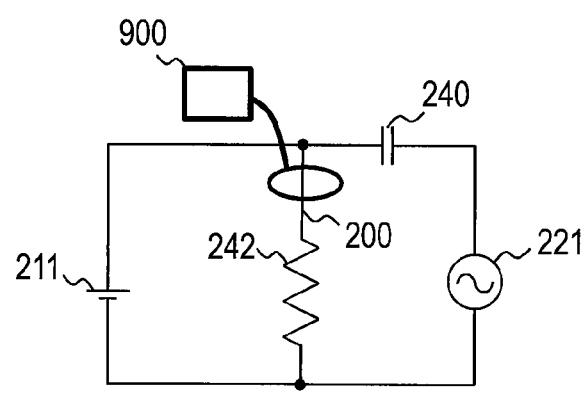
FIG. 4 is a diagram showing a configuration of a circuit that uses a capacitor to superimpose a direct current and an alternating current on one another.

A current sensor 900 to be inspected according to the present invention is the same as the current sensor shown in FIG. 2. The current sensor 900 comprises a core 910, a magnetometric sensor 920 and a main unit 930. The core 910 is made of a magnetic material (such as iron) and has the shape of a ring with a gap. The magnetometric sensor 920 is disposed in the gap of the core 910 and measures a current passing through a plane 911 surrounded by the core 910 by measuring a magnetic flux inside the core 910. A Hall element is commonly used as the magnetometric sensor 920. The main unit 930 displays and outputs a measurement result.

Figure 5:
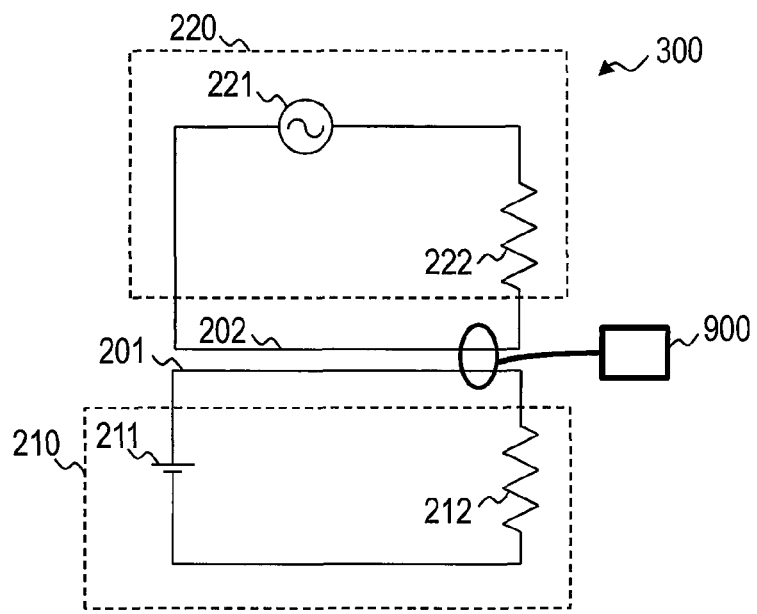
FIG. 5 is a diagram showing an example of a configuration of a current sensor inspection system 300 according to the present invention.

FIG. 5 shows an example of a configuration of a current sensor inspection system 300 according to the present invention. The current sensor inspection system 300 is a system for inspecting the current sensor 900. The current sensor inspection system 300 comprises a first wire 201, a second wire 202, a direct-current power supply device 210, and an alternating-current power supply device 220. The direct-current power supply device 210 comprises a direct-current power supply 211 capable of supplying a direct current of 100 A or larger and a resistor 212 and can output a value of a direct current. The alternating-current power supply device 220 comprises an alternating-current power supply 221 and a resistor 222 and can output a value of an alternating current. The first wire 201 and the second wire 202 are insulated from each other.

Figure 6:
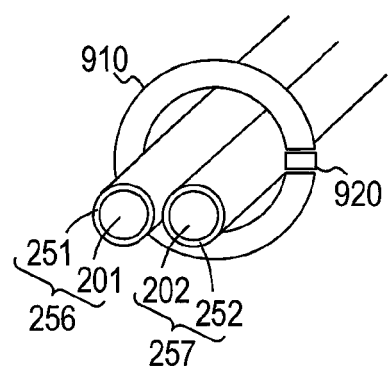
FIG. 6 is a diagram showing a first wire 201 and a second wire 202 inserted in a core 910.

Inspection can be performed in the following procedure. The first wire 201 and the second wire 202 are placed so as to pass through the plane 911 surrounded by the core 910 (placement step). FIG. 6 shows the first wire 201 and the second wire 202 inserted in the core 910. In FIG. 6, wires 256 and 257 are shown as being cut in the middle to show cross sections of the wires 256 and 257. As shown in FIG. 6, the "first wire 201" refers to a conductor part of the wire 256 having an insulating layer 251, and the "second wire 202" refers to a conductor part of the wire 257 having an insulating layer 252. The direct-current power supply device 210 is connected to the first wire 201 (first connection step). The alternating-current power supply device 220 is connected to the second wire 202 (second connection step). The direct-current power supply device 210 and the alternating-current power supply device 220 provide a current at the same time. The value of the direct current output from the direct-current power supply device 210 is compared with the value of the direct current output from the current sensor 900, and the value of the alternating current output from the alternating-current power supply device 220 is compared with the value of the alternating current output from the current sensor 900 (inspection step).

With the current sensor inspection system 300, taking advantage of the characteristics of the current sensor 900 that measures the current passing through the plane 911 surrounded by the core 910, the direct current and the alternating current are not superimposed in one wire but passed through two wires insulated from each other. Therefore, the current sensor inspection system 300 does not require any arrangement for superimposition of currents and therefore has a simple configuration, and thus the current sensor inspection system 300 can precisely control the current passing through the core 910. The current sensor 900 measures a combined current passing through the plane 911 surrounded by the core 910 regardless of whether the current is passing through either or both of the two wires, so that it is possible to inspect the operation of the current sensor 900 when a direct current and an alternating current are superimposed on one another.

[First Modification]

The first wire 201 and the second wire 202 passing through the plane 911 surrounded by the core 910 are arranged side by side. Therefore, mutual induction can occur, and the first wire 201 can be affected by the alternating current flowing through the second wire 202, and an alternating-current component can flow through the first wire 201. When the alternating-current component flowing through the first wire 201 is significant enough to affect the precision of the inspection, the direct-current power supply device 210 can have a function of outputting the value of the alternating-current component.

In this case, in the inspection step, the sum of the value of the alternating current output from the alternating-current power supply device 220 and the value of the alternating-current component output from the direct-current power supply device 210 can be compared with the value of the alternating current output from the current sensor 900. In this way, the precision of the inspection can be improved by taking into consideration the mutual induction between the first wire 201 and the second wire 202.

[Second Modification]

FIGS. 7A and 7B show arrangements of the core 910, the first wire 201 and the second wire 202 for inspecting a current flowing through a bus bar. The core 910 shown in FIGS. 7A and 7B is shaped to comply with the bus bar. The expression "shape of a ring" in this application includes such a rectangular shape. In this example, the first wire 201 and the second wire 202 also have a rectangular cross section and are integrated with each other with an insulator 271 or 276 interposed therebetween into the same shape 270 or 275 as the bus bar. FIG. 7A shows an arrangement in which the first wire 201 and the second wire 202 are disposed on one another, and FIG. 7B shows an arrangement in which the first wire 201 and the second wire 202 are disposed side by side. Such arrangements have the same effects as in the first embodiment.

The direct-current power supply device 210 can have a function of outputting the value of an alternating-current component as in the first modification. In that case, the same effects as in the first modification can also be provided.

[Third Modification]

FIG. 8 shows a coaxial cable 260 having two conductor layers, an inner one of which is the first wire 201, and an outer one of which is the second wire 202. In FIG. 8, the coaxial cable 260 is shown as being cut in the middle to show the cross section of the coaxial cable 260. The inner conductor layer of the coaxial cable 260 is the first wire 201, an insulating layer 261 is disposed on the outer side of the first wire 201, the outer conductor layer of the coaxial cable 260 is the second wire 202, and an insulating layer 262 is disposed on the outer side of the second wire 202. The insulating layer 262 may be omitted.

If the first wire 201 is disposed on the inner side of the second wire 202 in this way, the magnetic field produced by the alternating current flowing through the second wire 202 is canceled at the position of the first wire 201, so that the first wire 201 is less affected by the alternating current flowing through the second wire 202. Therefore, the influence of the mutual induction on the inspection can be reduced without providing the direct-current power supply device 210 with the function of outputting the value of the alternating-current component as in the first modification.

The outer conductor of a typical coaxial cable is grounded, and a high-frequency signal is passed through the inner conductor. However, with the current sensor inspection system 300 according to the third modification, precise inspection can be achieved with a simple configuration by passing a direct current through the inner conductor and passing an alternating current through the outer conductor. When the coaxial cable 260 is a cable designed for passing a direct current of 100 A or larger therethrough, of course, the material and thickness of the coaxial cable 260 are suitable for the current value, unlike a coaxial cable for communication or broadcasting.

Furthermore, the current sensor inspection system according to the third modification is also advantageous in cases other than where a large direct current of 100 A or larger is passed. That is, if a small direct current and an alternating current are passed through different wires at the same time, the operation of the current sensor can be easily checked while the small direct current and the alternating current are superimposed on one another. This is because the first wire 201 is less affected by the alternating current in the arrangement according to the third modification, although the influence of the alternating current on the first wire 201 in the mutual induction is more significant as the direct current becomes smaller. Therefore, according to the third modification, the value of the direct current does not have to be limited to 100 A or larger, and the current sensor can be more precisely inspected with a simpler configuration.

The above description of examples (embodiments) of the present invention is given for the purposes of illustration and explanation. The description is not intended to be exhaustive nor to limit the present invention to the specific embodiments disclosed. Given the above teachings, various modifications and variations will be possible. The examples (embodiments) are selected to provide the best illustrations of the principle of the present invention and to allow those skilled in the art to take advantage of the present invention in various examples (embodiments) and various modifications in various contemplated practical applications. All those modifications and variations are included in the scope of the present invention defined by the accompanying claims that are interpreted in accordance with the breadth justly, legally and fairly determined.

What is claimed is:

1. A current sensor inspection system that inspects a current sensor that has a core made of a magnetic material and having the shape of a ring with a gap and a magnetometric sensor disposed in the gap and measures a current passing through a plane surrounded by the core by measuring a magnetic flux inside the core with the magnetometric sensor, the current sensor inspection system comprising:
   a first conductor and a second conductor passing through the plane surrounded by the core;
   a direct-current power supply device capable of supplying a direct current of 100 A or larger and outputting a value of a direct current; and
   an alternating-current power supply device capable of outputting a value of an alternating current,
   wherein the first conductor and the second conductor are insulated from each other,
   only the direct-current power supply device is connected to the first conductor, and
   only the alternating-current power supply device is connected to the second conductor.

2. The current sensor inspection system according to claim 1, wherein the first conductor is an inner conductor layer of a coaxial cable having two conductor layers, and the second conductor is an outer conductor layer of the coaxial cable.

3. The current sensor inspection system according to claim 1, wherein the direct-current power supply device is capable of outputting a value of an alternating-current component contained in a current.

4. The current sensor inspection system according to claim 1, wherein the core is designed for a bus bar, and
   the first conductor and the second conductor are integrated with each other with an insulator interposed therebetween into a same shape with the bus bar.

5. The current sensor inspection system according to claim 3, wherein the core is designed for a bus bar, and
   the first conductor and the second conductor are integrated with each other with an insulator interposed therebetween into a same shape with the bus bar.

6. A current sensor inspection system that inspects a current sensor that has a core made of a magnetic material and having the shape of a ring with a gap and a magnetometric sensor disposed in the gap and measures a current passing through a plane surrounded by the core by measuring a magnetic flux inside the core with the magnetometric sensor, the current sensor inspection system comprising:
   a coaxial cable having two conductor layers that pass through the plane surrounded by the core;
   a direct-current power supply device capable of outputting a value of a direct current; and
   an alternating-current power supply device capable of outputting a value of an alternating current,
   wherein only the direct-current power supply device is connected to an inner conductor layer of the coaxial cable, and
   only the alternating-current power supply device is connected to an outer conductor layer of the coaxial cable.

7. A current sensor inspection method for inspecting a current sensor that has a core made of a magnetic material and having the shape of a ring with a gap and a magnetometric sensor disposed in the gap and measures a current passing through a plane surrounded by the core by measuring a magnetic flux inside the core with the magnetometric sensor, the current sensor inspection method comprising:
   a placement step of placing a first conductor and a second conductor insulated from each other so as to pass through the plane surrounded by the core;
   a first connection step of connecting a direct-current power supply device to the first conductor, the direct-current power supply device being capable of supplying a direct current of 100 A or larger and outputting a value of a direct current;

a second connection step of connecting an alternating-current power supply device to the second conductor, the alternating-current power supply device being capable of outputting a value of an alternating current; and an inspection step of making the direct-current power supply device and the alternating-current power supply device provide a current at the same time, comparing a value of a direct current output from the direct-current power supply device with a value of a direct current output from the current sensor, and comparing a value of an alternating current output from the alternating-current power supply device with a value of an alternating current output from the current sensor.

8. The current sensor inspection method according to claim 7, wherein the first conductor is an inner conductor layer of a coaxial cable having two conductor layers, and the second conductor is an outer conductor layer of the coaxial cable.

9. The current sensor inspection method according to claim 7, wherein the direct-current power supply device is capable of outputting a value of an alternating-current component contained in a current, and in the inspection step, a sum of the value of the alternating current output from the alternating-current power supply device and the value of the alternating-current component output from the direct-current power supply device is compared with the value of the alternating current output from the current sensor.

10. A current sensor inspection method for inspecting a current sensor that has a core made of a magnetic material and having the shape of a ring with a gap and a magnetometric sensor disposed in the gap and measures a current passing through a plane surrounded by the core by measuring a magnetic flux inside the core with the magnetometric sensor, the current sensor inspection method comprising:

a placement step of placing a coaxial cable having two conductor layers so as to pass through the plane surrounded by the core;

a first connection step of connecting a direct-current power supply device to an inner conductor layer of the coaxial cable, the direct-current power supply device being capable of outputting a value of a direct current;

a second connection step of connecting an alternating-current power supply device to an outer conductor layer of the coaxial cable, the alternating-current power supply device being capable of outputting a value of an alternating current; and an inspection step of making the direct-current power supply device and the alternating-current power supply device provide currents at the same time, comparing a value of a direct current output from the direct-current power supply device with a value of a direct current output from the current sensor, and comparing a value of an alternating current output from the alternating-current power supply device with a value of an alternating current output from the current sensor.

* * * * *